US008700377B2

(12) United States Patent
Bolcato et al.

(10) Patent No.: US 8,700,377 B2
(45) Date of Patent: Apr. 15, 2014

(54) ACCELERATED ANALOG AND/OR RF SIMULATION

(75) Inventors: Pascal Bolcato, Echirolles (FR); Gerard Eichenmueller, Eybens (FR)

(73) Assignee: Mentor Graphics Corporation, Wilsonville, OR (US)

(*) Notice: Subject to any disclaimer, the term of this patent is extended or adjusted under 35 U.S.C. 154(b) by 660 days.

(21) Appl. No.: 10/554,143

(22) PCT Filed: Jul. 26, 2005

(86) PCT No.: PCT/EP2005/053648
§ 371 (c)(1),
(2), (4) Date: Feb. 1, 2007

(87) PCT Pub. No.: WO2007/012349
PCT Pub. Date: Feb. 1, 2007

(65) Prior Publication Data
US 2007/0299647 A1  Dec. 27, 2007

(51) Int. Cl.
  *G06F 17/50* (2006.01)
(52) U.S. Cl.
  USPC .......................................... 703/14; 716/106
(58) Field of Classification Search
  USPC ...................................... 703/14, 13
  See application file for complete search history.

(56) References Cited

U.S. PATENT DOCUMENTS

| 4,918,643 | A | | 4/1990 | Wong |
| 5,960,181 | A | * | 9/1999 | Sanadidi et al. ............... 703/21 |
| 6,154,716 | A | | 11/2000 | Lee |
| 6,212,490 | B1 | * | 4/2001 | Li et al. ........................... 703/14 |
| 6,424,959 | B1 | * | 7/2002 | Bennett et al. ................... 706/13 |
| 6,530,065 | B1 | * | 3/2003 | McDonald et al. ............... 716/4 |
| 6,671,862 | B1 | * | 12/2003 | Seward ........................ 716/113 |
| 6,704,697 | B1 | * | 3/2004 | Berevoescu et al. ............ 703/19 |
| 6,895,524 | B2 | * | 5/2005 | Korobkov ..................... 713/500 |
| 7,003,753 | B2 | * | 2/2006 | Teene ............................. 716/12 |
| 7,110,929 | B1 | * | 9/2006 | Meares .......................... 703/14 |
| 7,149,666 | B2 | * | 12/2006 | Tsang et al. ..................... 703/2 |
| 7,159,202 | B2 | * | 1/2007 | Lee et al. ..................... 716/103 |
| 2003/0204387 | A1 | | 10/2003 | Upreti |
| 2004/0083437 | A1 | | 4/2004 | Gullapalli et al. |

OTHER PUBLICATIONS

Geoff Dawe, "Design and Simulation of an RF Transceiver ASIC", May 1998, Communication Systems Design, vol. 4, No. 5, pp. 1-24.*
Ken Kundert et al., "Achieving accurate results with a circuit simulator", 1993, IEE Colloquium on SPICE: Surviving Problems in Circuit Evaluation, pp. 1-13 with citation.*

(Continued)

*Primary Examiner* — Macy C Jacob
(74) *Attorney, Agent, or Firm* — Klarquist Sparkman, LLP

(57) ABSTRACT

A method and system for performing analog and RF simulation is disclosed that balances the need for accuracy with the desire for increased simulation speed by using two different circuit descriptions, one description is used during the simulation where needed for accuracy and the other circuit description is used where needed to speed the simulation. For example, one circuit description may include parasitic information and is used where necessary to maintain accuracy and, whereas a reduced circuit description (with at least some parasitic information removed) can be used to enhance speed. This combined solution that uses two different, but related, circuit descriptions has substantially increased the speed of simulation with minimal sacrifice of accuracy.

26 Claims, 9 Drawing Sheets

(56) References Cited

OTHER PUBLICATIONS eCircuit Center, "Transient Analysis", 2003, retrieved on Jul. 10, 2010 from http://www.ecircuitcenter.com/SpiceTopics/Transient Analysis/TransientAnalysis.htm.*
Saleh et al, "Clock Skew Verification in the Presence of IR-Drop in the Power Distribution Network", IEEE Transactions on Computer-Aided Design of Integrated Circuits and Systems, vol. 19, No. 6, Jun. 2000.*
Kielkowski, Ron, "Inside Spice", Second Edition, McGraw-Hill, Inc., 1998, pp. 15-41.*
Freund et al., "Small-Signal Circuit Analysis and Sensitivity Computations with the PVL Algorithm," *IEEE Transactions on Circuits and Systems II: Analog and Digital Signal Processing*, pp. 577-587 (Aug. 1996).
International Search Report and Written Opinion for International Application No. PCT/EP2005/053648 (Jul. 26, 2005).
Feldmann, P. et al., "Computation of circuit waveform envelopes using an efficient, matrix-decomposed harmonic balance algorithm," *International Conference on Computer-Aided Design*, pp. 295-300 (1996).
Ho, C. et al., "The Modified Nodal Approach to Network Analysis," *IEEE Transactions on Circuits and Systems*, vol. CAS-22, No. 6, pp. 504-509 (Jun. 1975).
Ngoya, E. et al., "Envelop Transient Analysis: A New Method for the Transient and Steady State Analysis of Microwave Communication Circuits and Systems," *IEEE MTT-S Digest*, pp. 1365-1368 (1996).

\* cited by examiner

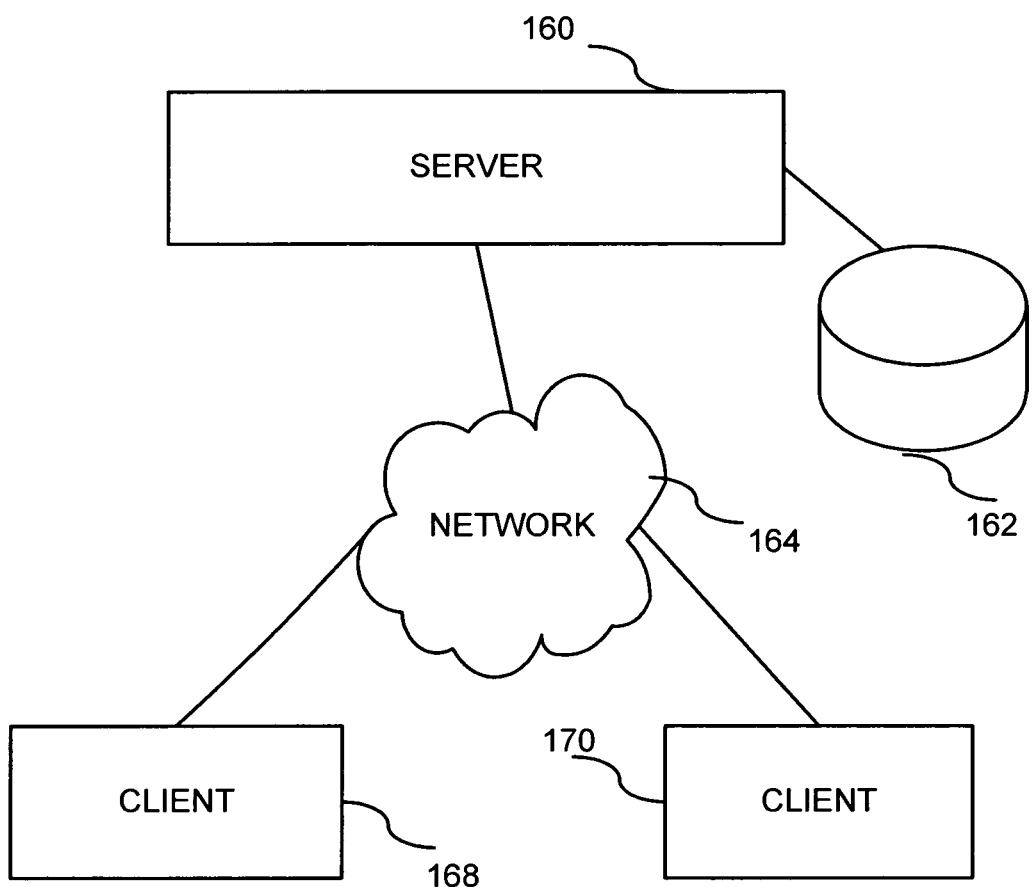

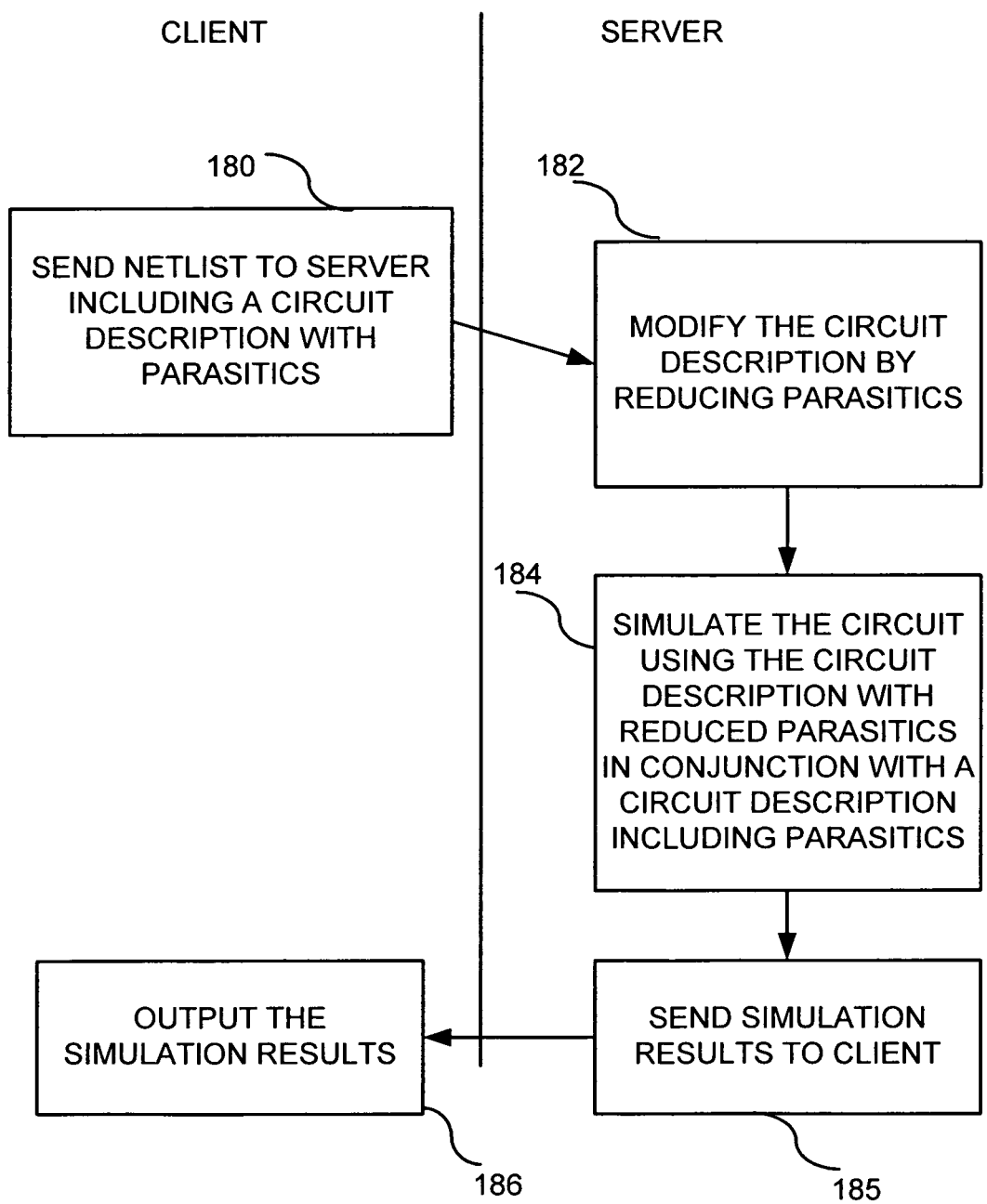

US 8,700,377 B2

ACCELERATED ANALOG AND/OR RF SIMULATION

CROSS REFERENCE TO RELATED APPLICATIONS

This is the U.S. National Stage of International Application No. PCT/EP2005/053648, filed Jul. 26, 2005.

FIELD OF THE INVENTION

The present invention generally relates to simulation, and more particularly to analog and RF simulation.

BACKGROUND

The design of an integrated circuit (IC) is an extremely complicated task and requires a structured approach. Generally, the IC design flow can be broken down into the steps of implementation and verification. Implementation usually involves the creation of a specification, an RTL model, a transistor-level model, or a gate-level netlist. Verification is usually performed by simulators that test the functionality of an IC in a software environment before creation of a physical prototype. To perform such testing, simulators predict the behavior of a system by using mathematical models of the system components. Based on the circuit signals, different types of simulators are chosen to perform the simulation, such as digital, analog, and RF simulators.

For digital simulation, the modeling begins with a software program that describes the behavior or functionality of a circuit. This software program is written in a hardware description language (HDL) that defines an algorithm to be performed with limited implementation details. Designers direct behavioral synthesis tools to generate alternate architectures by modifying constraints (such as clock period, number and type of data path elements, and desired number of clock cycles). Behavioral synthesis tools convert the HDL program into a register transfer level (RTL) description, which is used for simulation. The RTL description is used to ultimately generate a netlist that includes a list of components in the circuit and the interconnections between the components. This netlist is used to create the physical integrated circuit. Digital simulation usually relates to events where data changes on clock cycles and the logical voltage levels are limited to two or three.

Analog simulation is used for DC, AC and transient analyses and operates on a transistor-level description, which is a full netlist of the physical circuit containing detailed architectural and parasitic information. Analog behavioral languages (e.g., Verilog-AMS or VHDL-AMS) also exist and allow the user to model an analog design at a higher level of abstraction. The analog design process includes the creation of schematics, layout, and extraction resulting in the netlist used for simulation. The analog simulator (e.g., SPICE) uses the netlist as an input to formulate non-linear equations for the circuit to solve for the unknown waveform V(t). Iterative methods, such as Newton-Raphson, can be used to solve these non-linear systems of equations. For transient analysis, most analog simulators choose time points at which the system is solved in order to meet a desired accuracy criteria. Thus the basic difference between analog and digital simulators is that an analog simulator considers the voltages and currents in a circuit to be continuous quantities, rather than quantized into high/low values, as in digital. This allows analog simulators to calculate voltage and current as a function of time.

RF simulators perform both steady-state analysis and modulated steady-state analysis (also called envelope analysis). The steady state is defined as the state when all initial transients have vanished, and the circuit operates with periodic or quasi-periodic large signals. There exists two types of algorithms to compute steady state: the Shooting algorithm in the time domain and the Harmonic Balance algorithm in the frequency domain. Modulated steady-state analysis is an algorithm dedicated to the simulation of circuits stimulated by (non periodic) modulated signals. It efficiently handles the modulation information carried by RF signals. The output of the modulated steady-state analysis is a time-varying spectrum. An example use of RF simulators is for RF transceivers found in mobile phones. These circuits include low noise amplifiers, mixers, filters, oscillators etc., which operate in a RF frequency range (e.g., typically from a few 100 MHz to 5 GHz).

However, a problem exists with analog and RF simulation. It is desirable to increase the speed of the simulation, but maintain accuracy. Existing techniques for increasing speed, sacrifice accuracy and existing techniques for increasing accuracy, substantially slow the speed. For example, to increase accuracy it is possible to include parasitic information into the simulation. Parasitic information relates to elements not included in the original netlist, but are added due to layout and extraction. For example, two electrical paths placed in close proximity during layout will generate a coupling capacitor during extraction. Such a coupling capacitor was not present in the original netlist, but was added because of the physical layout of the circuit. Such parasitic information may include resistors, inductors, capacitors, etc. Generally, the parasitic information makes the matrices used during simulation much larger and denser slowing the simulation time substantially. There are a number of prior-art techniques for reducing parasitic information, such as "circuit simplification" and "reduced order modeling". Circuit simplification simply removes parasitic information from the circuit description to speed up simulation. The parasitic information may be listed in the circuit netlist or in a separate file (e.g., a DSPF) and, once identified, can simply be deleted from the circuit description. "Reduced order modeling" reduces parasitics by building a model of the parasitics imitating their functional behavior but in a simplified and more compact form. While removing, reducing, or modeling the parasitic information does make factorization simpler, it sacrifices the accuracy of the simulation. For example, even though the parasitic information often relates to components that are less significant in the simulation, their removal does modify the ultimate solution.

Thus, it is desirable to reconcile the competing interests of increasing the speed of circuit simulation, while obtaining a high level of simulation accuracy that incorporates parasitic elements.

SUMMARY

The present invention balances the need for accuracy with the desire for increased simulation speed by using two different circuit descriptions, one description is used during the simulation where needed for accuracy and the other circuit description is used where needed to speed the simulation. For example, one circuit description including parasitic information is used where necessary to maintain accuracy and, a reduced circuit description (with at least some parasitic information removed) is used to enhance speed. This combined solution that uses two different, but related, circuit descriptions has substantially increased the speed of simulation with minimal sacrifice of accuracy.

The invention may be applied to analog or RF simulation (including the harmonic balance method and the shooting method)

These features and others of the described embodiments will be more readily apparent from the following detailed description, which proceeds with reference to the accompanying drawings.

BRIEF DESCRIPTION OF THE DRAWINGS

FIG. 8 shows a network environment in which the system may be used.

FIG. 9 shows a flowchart of a method for simulating over the network of FIG. 8.

DETAILED DESCRIPTION

Figure 1:
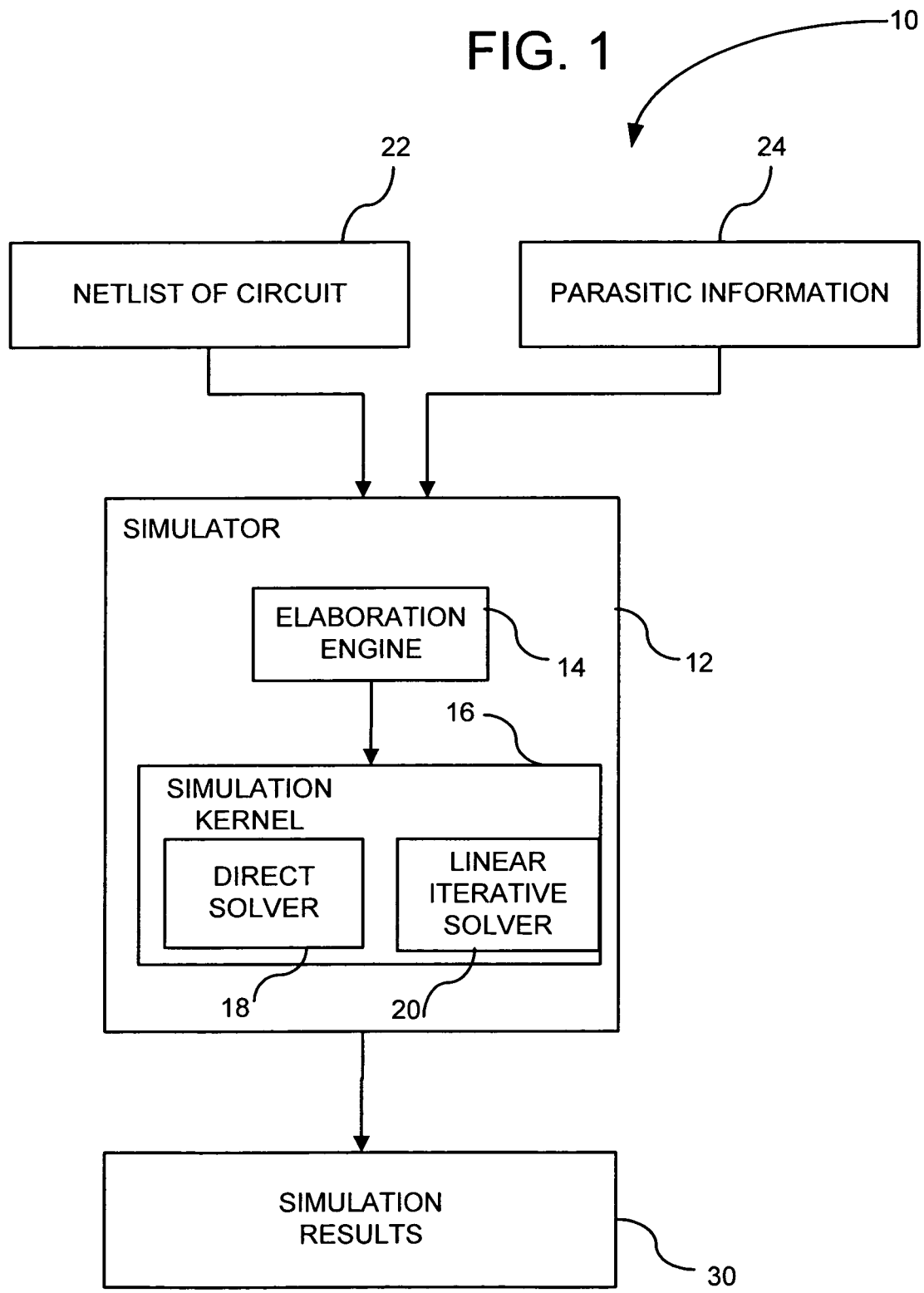
FIG. 1 shows a simulator system used to simulate circuits according to the invention.

FIG. 1 shows a simulator environment 10 including an analog or RF simulator 12, used for AC, DC, transient analysis, or RF analysis. The simulator 12 has an elaboration engine 14 coupled to a simulator kernel 16. The simulator kernel 16 includes one or both of a direct solver 18 and a linear iterative solver 20. Generally, the simulation kernel forms a system of linear equations (AC analysis) or non-linear equations (DC, transient and RF analysis) to solve the well-known circuit equations $Ax=B$ or $F(x)=0$, respectively.

A circuit description that includes components is provided to the simulator 12 through a netlist 22, which may take many forms. For example, the netlist may be a transistor-level description, which is a full netlist of the physical circuit containing detailed architectural and parasitic information or the netlist may be derived from an analog behavioral language (e.g., Verilog-AMS or VHDL-AMS). Alternatively, the parasitic information may be contained in a separate file 24 (e.g. DSPF). In any event, the netlist normally contains a list of components in the circuit, the parameter values, and connection node names. The simulator 12 uses the netlist 22 and the parasitic information 24 to simulate the circuit and provide simulation results 30 in any desired form, such as on a display, in an output file, etc.

Figure 2:
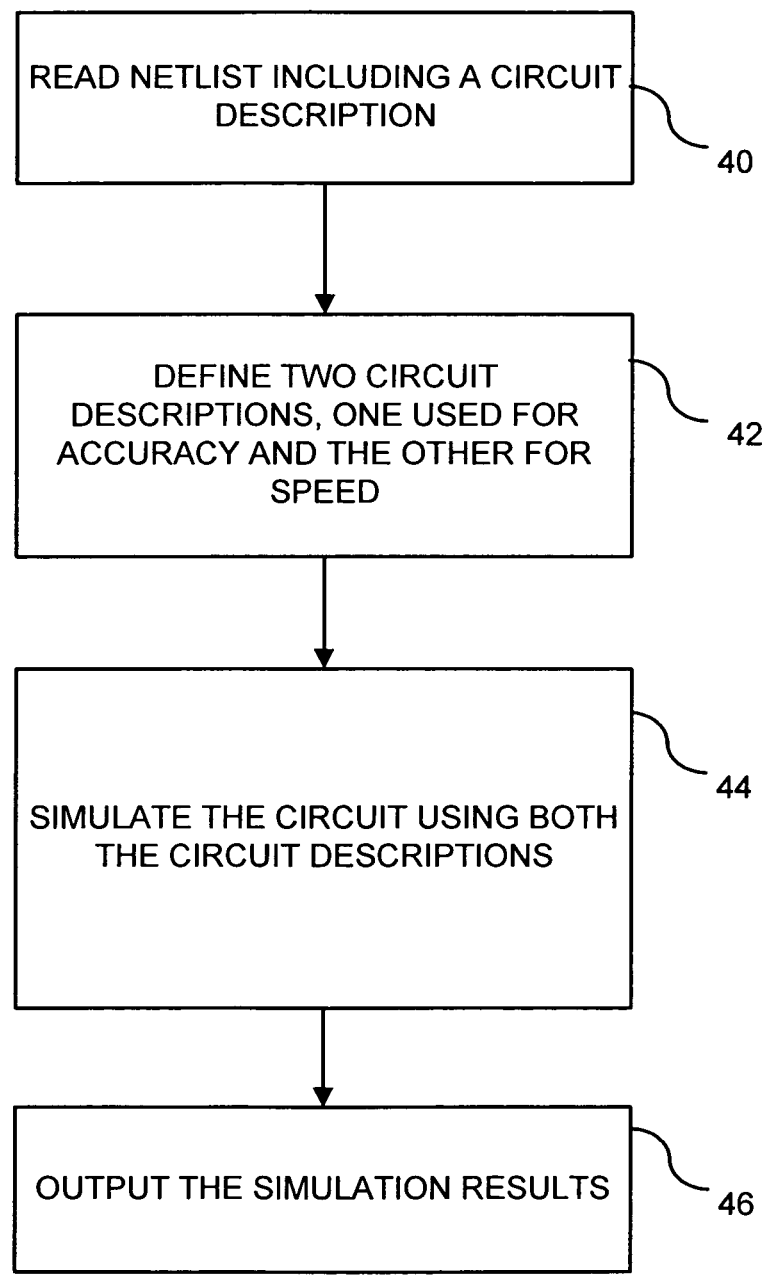
FIG. 2 is a flowchart of a method for simulating circuits using two circuit descriptions that differ from each other according to the invention.

FIG. 2 is a flowchart of a method for performing the simulation using the simulator 12 of FIG. 1. In process block 40, the simulator 12 reads the netlist that includes a circuit description containing both components and parasitic information. This reading may be only a netlist file that includes parasitic information or the reading may be of many files, such as separate netlist and parasitic files. In process block 42, the simulator 12 defines two circuit descriptions, one for accuracy and one for speed, to be used in a cooperative manner in the simulation. For example, one circuit description can be used to compute $F(x)$ (to obtain accuracy), while the other circuit description is used to factorize matrices (to obtain speed). A simple example of making the circuit descriptions different relates to parasitic information. For example, one circuit description may include parasitic information, while the other circuit description has parasitic information removed. The extent that the parasitics are removed is based on the particular design and application, and may easily be modified. Such modification is described further below in relation to FIG. 3. In process block 44, the simulator performs circuit simulation by using both circuit descriptions. FIGS. 4-7 show the circuit simulation in further detail, but in summary, a system of equations is formed wherein part of the equations use one circuit description for accuracy and part of the equations use a different circuit description for obtain speed. FIGS. 4-7 focus on a specific example relating to parasitics. In these examples, it should be noted that the circuit description with parasitics does not necessarily mean a circuit description identical to that of the netlist. The circuit description with parasitics may also be partially modified from the original, but it normally contains substantially more parasitic information than the other circuit description. Finally, in process block 46, the simulation results are outputted in any desired manner. For example, the simulation results may be displayed, sent through a network, stored, etc.

Figure 3:
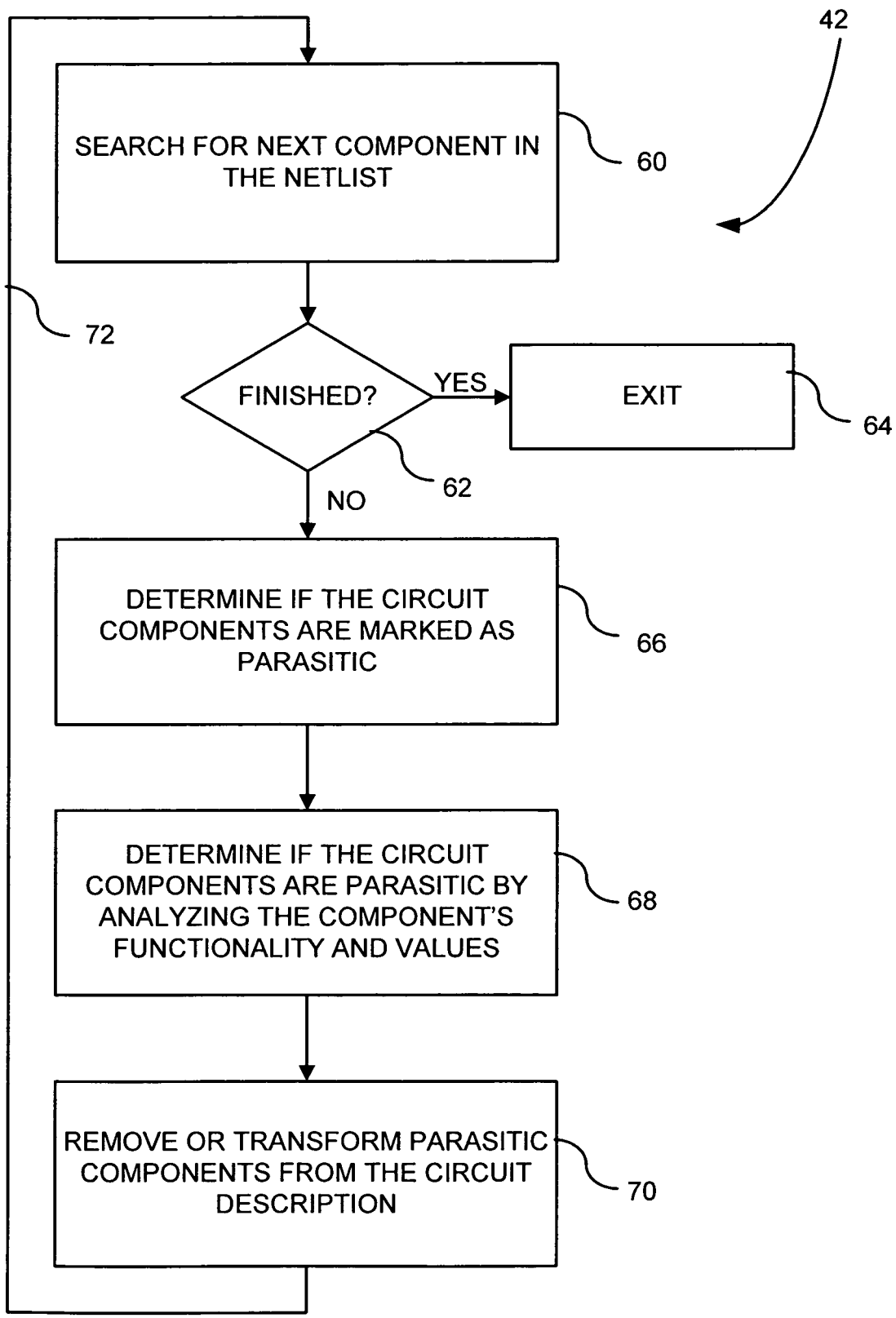
FIG. 3 is a flowchart of a method for creating a modified circuit description with reduced parasitic information.

FIG. 3 shows a more detailed flowchart of process block 42 (FIG. 2). In process block 60, the netlist is searched for a next component to be evaluated. Thus, in this embodiment the netlist is searched in order starting from the first component listed, but other search methods may be used. In decision block 62, a determination is made whether all of the components in the netlist have been evaluated and if yes the modified circuit description is completed (process block 64). If no, then there are two modes of determining whether the component is parasitic as discussed in process blocks 66 and 68. Either one or both of these modes may be used depending on the particular application. In process block 66, a determination is made if the circuit components are marked as parasitic. Such marking is usually performed by the designer and is incorporated directly in the netlist 22 or through parasitic file 24. In process block 68, a determination is made whether the component is parasitic based on the electrical properties of the component and its functional relationship in the circuit. Thus, the term parasitic as used herein may include both circuit elements added during layout and extraction due to physical properties of the circuit and the term parasitic may include circuit elements satisfying the strategy defined below that relate to electrical properties of the component and/or its functional relationship in the circuit. Based on the information of process blocks 66 and 68, in process block 70, the parasitics are removed or transformed in the circuit description to modify it. The process loops as shown at 72 until the desired number of circuit components are analyzed. There are several ways of organizing the circuit description including parasitics and the modified circuit description with reduced parasitics. One way is to provide two lists, one with the circuit description with parasitics removed and a second list including the parasitic information. Thus, to obtain the circuit description including parasitics, a combination of the two lists is used. Another technique is to store two separate circuit descriptions, one being the circuit description with parasitics and the other being the modified circuit description with reduced parasitics.

The following are examples of a strategy for defining whether a device is parasitic according to its electrical or functional properties:

If a resistor is larger than a threshold value, then it is considered parasitic.

If a resistor is smaller than a threshold value, then it is transformed into a null voltage source in series with a resistor. The voltage source is placed in a first list (including non parasitic components) and the series resistor is placed in the second list (including parasitic elements).

If a capacitor is smaller than a threshold then it is considered parasitic.

If an inductor is smaller than a threshold then it is transformed into a null voltage source in series with an inductor. The voltage source is placed in the first list and the series inductor is placed in the second list.

If a K element (a mutual coefficient between two inductors) is related to at least one parasitic inductor then it is considered parasitic.

If a K element is below a threshold then it is considered parasitic.

Figure 4:
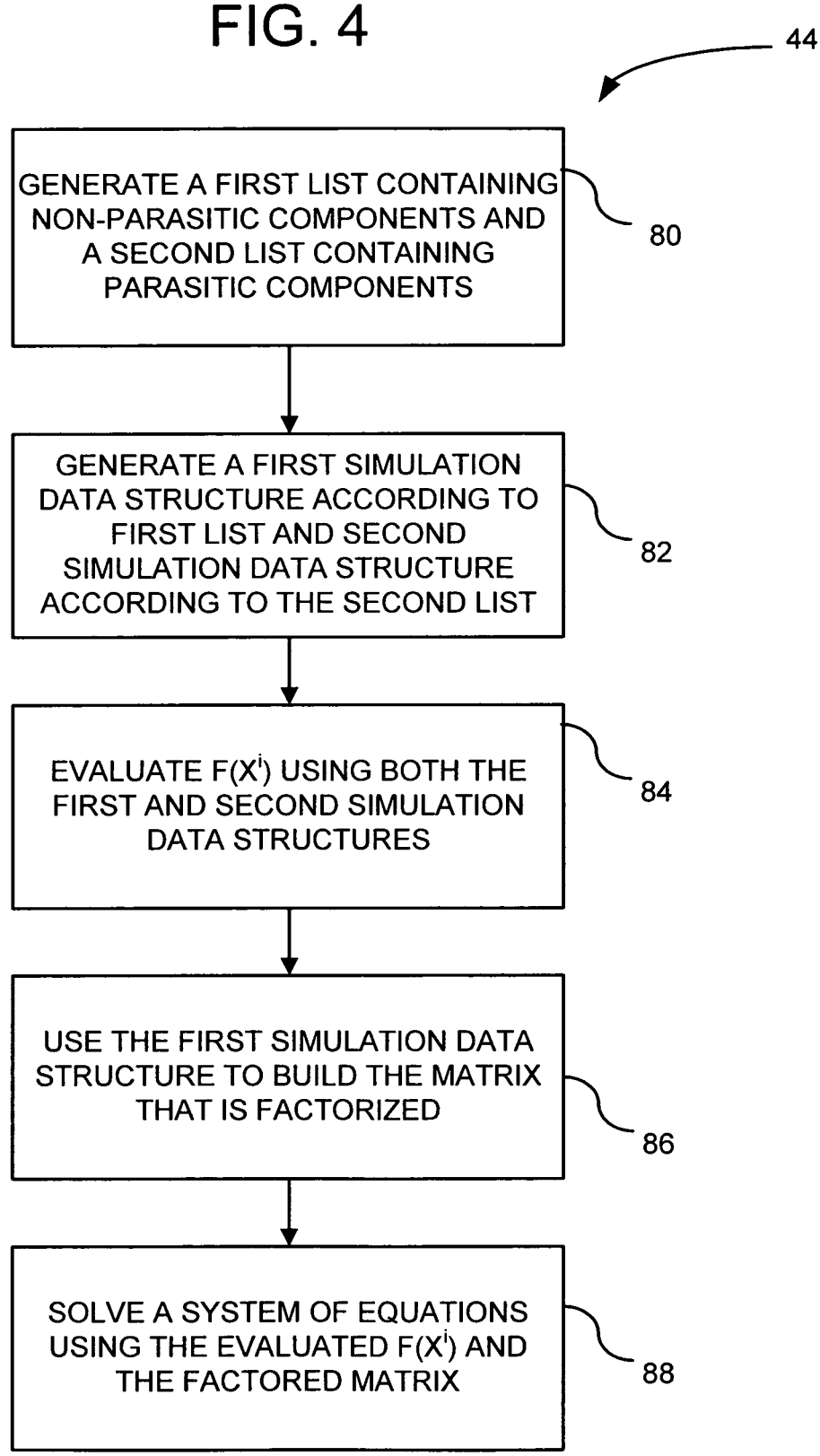
FIG. 4 is a detailed flowchart of a method for simulating the circuit using two circuit descriptions.

FIG. 4 shows a detailed flowchart describing more fully an example of process block 44. In process block 80, a first list containing non-parasitic components (or a list with the number of parasitic components reduced) is generated and a second list containing parasitic components is generated. Based on these lists, two simulation data structures are formed (process block 82), the first containing non-parasitic components and the second including parasitic components. In order to solve the equation $J\Delta X=-F(X')$ corresponding to a Newton-Raphson iteration the function $F(X^i)$ is evaluated using the first and second data structures (process block 84) (which includes parasitics), while the matrix J, which needs to be factorized, is built using only the first simulation data structure with reduced parasitics (process block 86). The matrix J approaches the full Jacobian matrix. Thus, J and $F(X^i)$ are interrelated through the equation, but based on different circuit descriptions. Finally, in process block 88, the system of equations identified above are solved. By approaching the Jacobian matrix using a matrix built with reduced parasitics, the simulation is much faster. However, with $F(X^i)$ evaluated using substantially the full circuit description including parasitics, the accuracy of the simulation is maintained at a high level.

Figure 5:
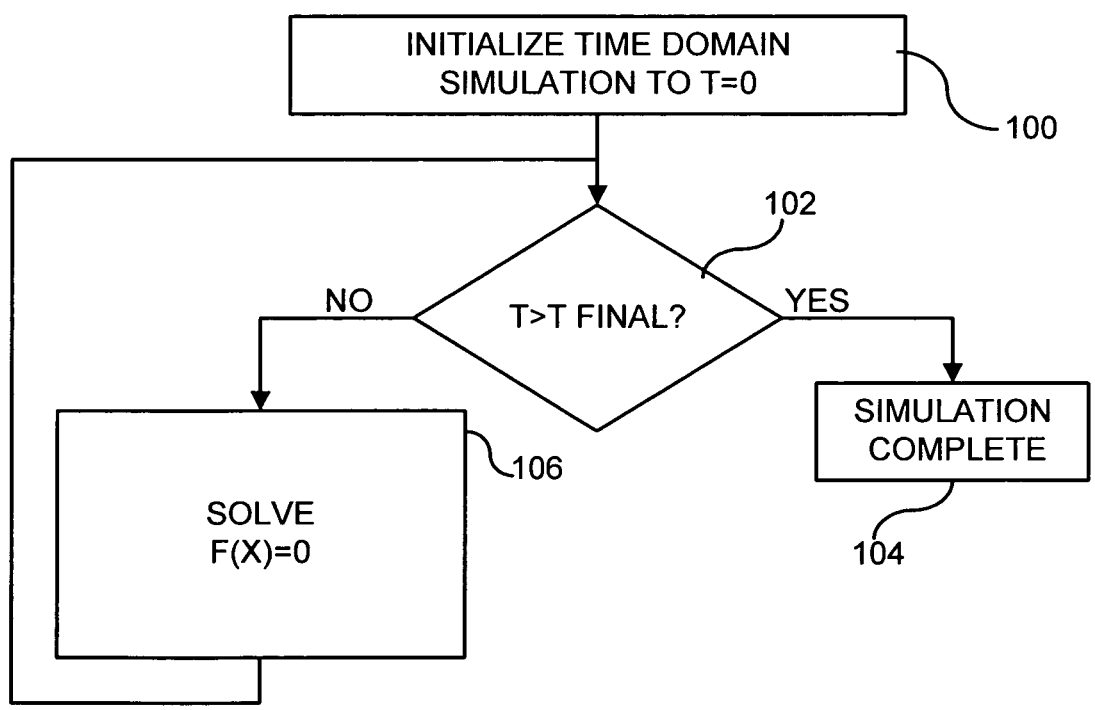
FIG. 5 shows an example of a simulation loop used in transient analysis.

FIG. 5 is a high-level example of a simulation flowchart for transient analysis. In process block 100, the time T is initialized to zero. In decision block 102, the time is checked to determine whether T has reached T Final, meaning the desired time frame has been simulated. If yes, then simulation is complete (process block 104). If no, then simulation continues in process block 106 where the system of equations for $F(x)=0$ are solved for the current time.

Figure 6:
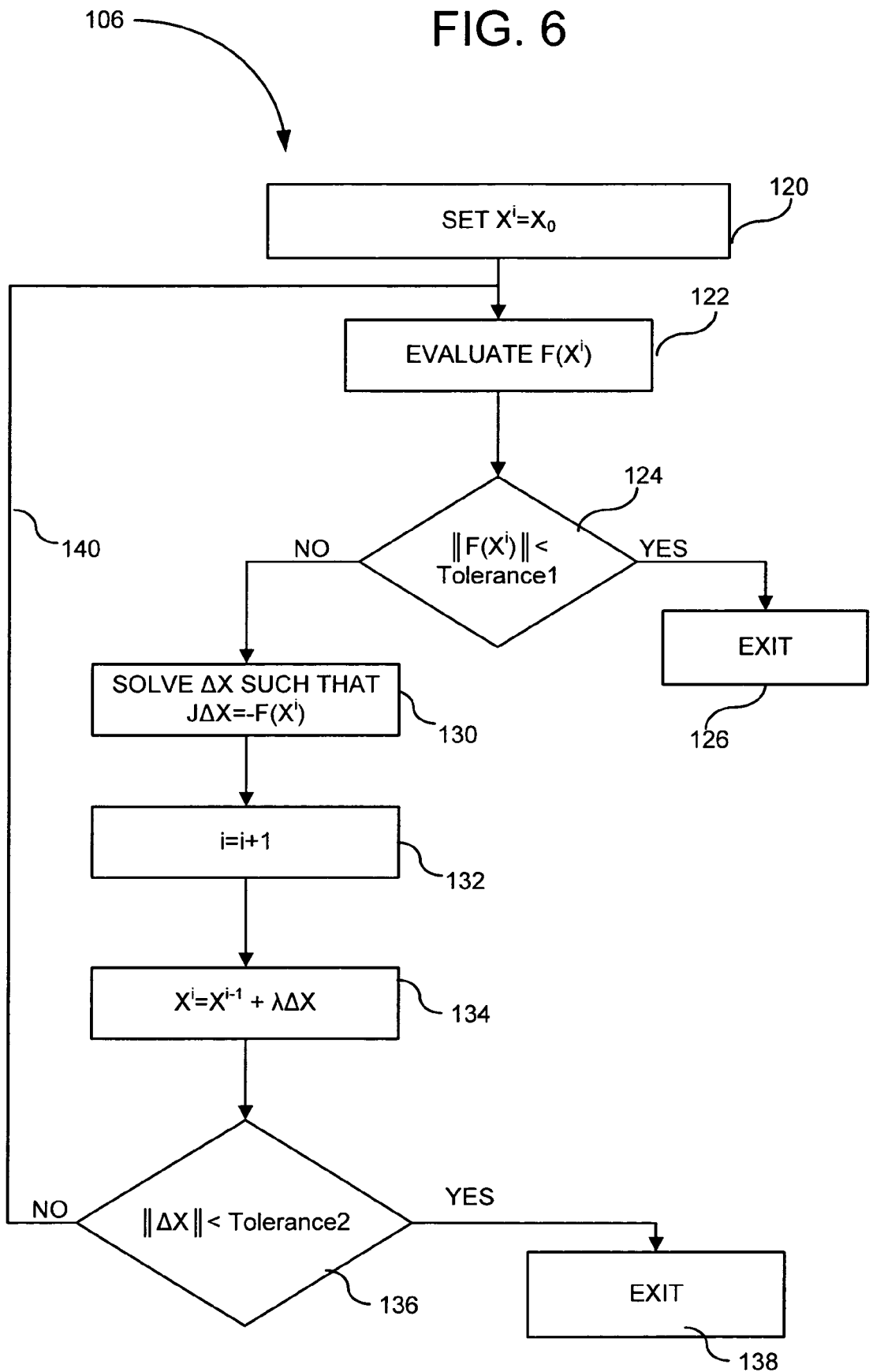
FIG. 6 provides a detailed flowchart used by an iterative solver to solve a system of non-linear equations.

FIG. 6 is a flow chart of a method for solving block 106 of FIG. 5. In process block 120, an initial value $X_0$ is determined for $X^1$. Such an initial value is a prediction of the circuit solution that can be extrapolated from solutions at previous time points. In process block 122, an evaluation of $F(X^i)$ is performed. To perform this evaluation both data structures (see process block 82, FIG. 4) are used. By using both data structures, substantially the full circuit description is used including parasitic components. In decision block 124, the norm of $F(X^i)$ is compared to a predetermined tolerance. If the norm of $F(X^i)$ is below that tolerance, then the solution is close enough to zero that the simulation is complete (process block 126). Otherwise, further processing is needed starting with process block 130. In process block 130, a factorization of the Jacobian matrix J is necessary in order to solve for $\Delta X$. In order to perform such a factorization, only the first simulation data structure is used to build the matrix to be factorized so as to reduce the complexity caused by parasitic components. Of course, the evaluation of $F(X^i)$ was performed using a circuit description including parasitics. Thus, two different parts of the same equation are formed using two different (but related) circuit descriptions: in this example, one without (or reduced) parasitics and the other with parasitics. In process block 132, the index "i" is incremented and the next $X^i$ is set equal to the current $X^i$ plus $\Delta X$ (process block 134). In decision block 136, the norm of $\Delta X$ is compared to a predetermined tolerance and if it is below that tolerance the simulation is ended at process block 138. Thus, if the $\Delta X$ is not a significant enough number, as to change $X^i$, then the simulation is terminated. Otherwise, the new $X^i$ is used to evaluate $F(X^i)$ again as shown by arrow 140.

Figure 7:
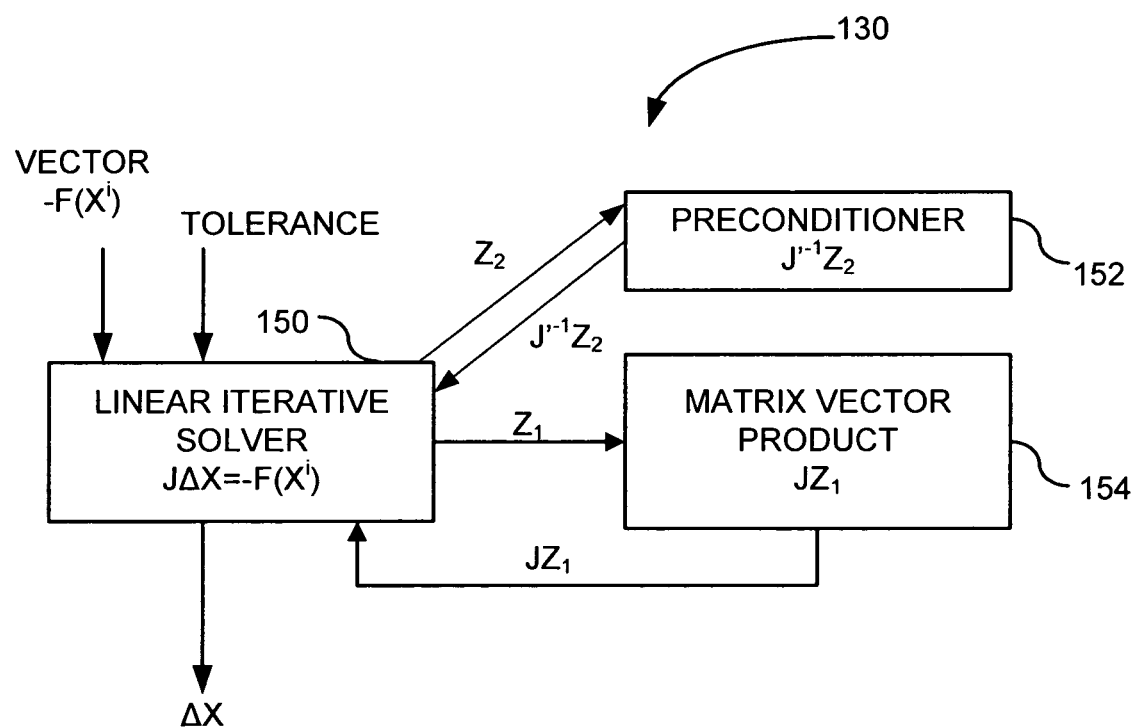
FIG. 7 provides an example of a linear iterative solver using a preconditioner.

FIG. 7 shows one example of a linear iterative solver for computing process block 130 of FIG. 6. A linear iterative solver is shown at 150 and receives as inputs the vector $-F(X^i)$ and a tolerance value. The linear iterative solver 150 calls a preconditioner 152, which is used to facilitate convergence. The preconditioner 152 factorizes a Jacobian matrix J', which is built by using the circuit description with reduced parasitic information and uses $Z_2$, which is an internal vector calculated by the linear iterative solver. The linear iterative solver also needs the result $JZ_1$ of a matrix vector product for an internal vector $Z_1$. The matrix vector product 154 is computed using the circuit description containing parasitic information. For RF simulation the matrix J might not exist explicitly. This means that $JZ_1$ is computed in an implicit way. It can also be accomplished based on the reduced circuit description. This interaction between the linear iterative solver 150, the preconditioner 152 and the matrix vector product 154 may be performed multiple times in order to approach the solution LX by a linear combination of the internal vectors. Thus, it can be seen that different parts of the simulation are carried out with different circuit descriptions, sometimes including parasitics and other times having reduced parasitics to provide a proper balancing between speed and accuracy.

FIG. 8 shows that portions of the system 10 may be applied to a distributed network, such as the Internet. For example, a server computer 160 may have an associated database 162 (internal or external to the server computer). The server computer is coupled to a network shown generally at 164. One or more client computers, such as those shown at 168 and 170, are coupled to the network to interface with the server computer using a network protocol.

FIG. 9 shows a flow diagram using the method on the network of FIG. 8. In process block 180, the netlist is sent from a client computer, such as 168, to the server computer 160. In process block 182, the circuit description is modified by reducing the number of parasitic components. In process block 184, the circuit is simulated wherein a part of the solution uses the substantially full circuit description and a part of the solution uses a modified circuit description with reduced parasitic components. In process block 185, the results of the simulation are sent though the network to the client computer 168. Finally, in process block 186, the results are displayed to the user.

Having illustrated and described the principles of the illustrated embodiments, it will be apparent to those skilled in the art that the embodiments can be modified in arrangement and detail without departing from such principles.

It should be recognized that use of the term "circuit description" includes the circuit description as defined by the netlist or it may be generated from the netlist so as to have some variations from the netlist. Additionally, in the case that the parasitic information is separated from the netlist, the circuit description may be as defined by the netlist in combination with the parasitic information or may have some variations from such combination. In any event, the circuit description includes parasitic information not included in the modified circuit description.

Further, it will be recognized that although many of the figures herein discuss parasitic information, the invention also includes other modifications to the circuit description. For example, elements can be eliminated from one circuit description based on importance in the circuit to speed simulation.

Still further, it will be recognized that a form of the equation $J\Delta X=-F(X^i)$ includes the equation $JX^{i+1}=-F(X^i)+JX^i$. Other forms may also be used.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

The invention claimed is:

1. A method of simulating a circuit using an analog or RF simulator, comprising:
    defining two circuit descriptions of the circuit to be used during the simulation, a first circuit description used for accuracy of the simulation and a second circuit description, separate and different from the first circuit description, used for increasing the speed of the simulation; and
    simulating the circuit using both the first and second circuit descriptions, without the first and second circuit descriptions being combined into a single netlist, the simulating comprising using the first circuit description during at least one simulation time step and also using the separate second circuit description during the at least one simulation time step.

2. The method of claim 1, wherein the first circuit description comprises parasitic information and the second circuit description has the parasitic information removed or substantially reduced.

3. The method of claim 1, further comprising reading a netlist comprising parasitic information or reading a netlist and a separate file containing parasitic information, and wherein the first circuit description comprises all of the elements included in the netlist plus the parasitic information.

4. The method of claim 3, further comprising modifying the first circuit description to generate the second circuit description with reduced parasitic information, wherein modifying comprises:
    analyzing values and functionality of electrical components in the circuit to determine which components are parasitic information; and
    removing the parasitic information based on the analysis.

5. The method of claim 3, further comprising modifying the first circuit description to generate the second circuit description with reduced parasitic information, wherein modifying comprises:
    identifying circuit components marked as parasitic information; and
    removing the parasitic information based on the identification.

6. The method of claim 1, wherein simulating comprises solving a system of interrelated equations, wherein a part of the system of equations uses the first circuit description and wherein a part of the system of equations uses the second circuit description.

7. The method of claim 1, wherein simulating comprises:
    solving a form of the equation $J\Delta X=-F(X^i)$ wherein J is a Jacobian matrix related to the circuit components and built using the second circuit description, $\Delta X$ is a variable to be solved, F is a function, and $X^i$ is a value of a variable X for an iteration i;
    factorizing the matrix J;
    evaluating $F(X^i)$ using the first circuit description; and
    solving for $\Delta X$.

8. The method of claim 1, wherein the simulating comprises performing one or more of the following: DC, AC, transient analysis, steady-state analysis and modulated steady-state analysis.

9. The method of claim 1, wherein simulating further comprises factorizing a Jacobian matrix built using the second circuit description for preconditioning a linear iterative solver.

10. The method of claim 1, wherein the defining the two circuit descriptions comprises:
    forming a first list comprising non-parasitic components of the circuit;
    forming a second list comprising parasitic components of the circuit; and
    forming first and second simulation data structures using the first and second lists, respectively, and
    wherein the first circuit description is defined as a combination of the first and second simulation data structures, and the second circuit description is defined as only the first simulation data structure.

11. The method of claim 1, wherein the first and second circuit descriptions both comprise non-parasitic components.

12. The method of claim 11, further comprising evaluating $F(X^i)$, where F is a function and $X^i$ is a value of a variable X for an iteration i, using both the first and second simulation data structures for accuracy and performing a factorization of a Jacobian matrix built using only the first simulation data structure for increasing the speed of the simulation.

13. A computer configured to perform the method of claim 1.

14. An analog or RF simulator for simulating a circuit, comprising:
    a computer configured to implement:
        an elaboration engine that receives one or more lists associated with the circuit, the lists comprising a list of components in the circuit, interconnections between the components, and parasitic information, and that defines a first circuit description used for accuracy of the simulation and a second circuit description used for speed of the simulation, without the first and second circuit descriptions being combined into a single netlist during the simulation, the first circuit description being separate and different from the second circuit description; and
        a simulation kernel coupled to the elaboration engine that comprises at least a direct solver or linear iterative solver to simulate the circuit, wherein the simulation kernel solves a system of equations, at least one of the equations including a part formed using the first circuit description and a part formed using the separate second circuit description.

15. The analog or RF simulator of claim 14, wherein the computer is further configured to implement a preconditioner coupled to the linear iterative solver.

16. The analog or RF simulator of claim 15, wherein the one or more lists include a netlist and a file comprising parasitic information.

17. The analog or RF simulator of claim 14, wherein the simulation kernel evaluates $F(X^i)$, where F is a function and $X^i$ is a value of a variable X for an iteration i, using the first circuit description and performs a factorization of a Jacobian matrix J built using the second circuit description to solve an equation $J\Delta X=-F(X^i)$.

18. The analog or RF simulator of claim 14, further comprising a network coupled to the computer through which the first circuit description is received.

19. A simulator for simulating a circuit, comprising:
means for reading a first circuit description of the circuit that comprises a list of components in the circuit, the interconnections between the components, and parasitic information;
means for generating a second circuit description separate from the first circuit description by removing at least a part of the parasitic information from the first circuit description; and
means for simulating the circuit using substantially the first circuit description comprising the parasitic information, and the separate second circuit description with reduced parasitic information, without the first and second circuit descriptions being combined into a single netlist during the simulating.

20. The simulator of claim 19, further comprising means for solving a linear system of equations using an iterative solver or a direct solver.

21. The simulator of claim 19, wherein the means for simulating is capable of evaluating $F(X^i)$, where F is a function and $X^i$ is a value of a variable X for an iteration i, using the first circuit description and factorizing a Jacobian matrix J built using the second circuit description to solve an equation $J\Delta X=-F(X^i)$.

22. A method of simulating a circuit using an analog or RF simulator, comprising:
using a computer, generating a system of equations wherein at least one of the equations includes a part that uses, during the simulating, a first circuit description comprising parasitic information and a part that uses a second circuit description with parasitic information removed, the second circuit description being separate from the first circuit description, without the first and second circuit descriptions being combined into a single netlist during the simulating;
solving the system of equations in order to simulate the circuit; and
outputting the simulation results.

23. The method of claim 22, wherein generating the system of equations comprises solving a form of the equation $J\Delta X=-F(X^i)$ wherein J is a Jacobian matrix related to the circuit components, $F(X^i)$ is an evaluated solution, and $\Delta X$ is a variable to be solved.

24. The method of claim 23, wherein solving further comprises factorizing the Jacobian matrix J, which is built using the second circuit description, evaluating $F(X^i)$ using the first circuit description, and solving for $\Delta X$.

25. A method of simulating a circuit using an analog or RF simulator, comprising:
defining two circuit descriptions of the circuit to be used during the simulation, a first circuit description used for accuracy of the simulation and a second circuit description, different from the first circuit description, used for increasing the speed of the simulation;
forming a first list comprising circuit components without parasitic information;
forming a second list comprising circuit components with the parasitic information;
forming first and second simulation data structures using the first and second lists, respectively, wherein the first circuit description is defined as a combination of the first and second simulation data structures, and the second circuit description is defined as only the first simulation data structure; and
simulating the circuit using both the first and second circuit descriptions, the simulating comprising using both the first and second circuit descriptions during a single simulation time step and without the first and second circuit descriptions being combined into a single netlist during the simulating.

26. A method of simulating a circuit using an analog or RF simulator, comprising:
receiving from a client a first circuit description of the circuit to be used during a simulation, a first circuit description used for accuracy of the simulation;
generating a second circuit description of the circuit to be used during the simulation based on the first circuit description, the second circuit description being separate and different from the first circuit description and being used for increasing the speed of the simulation, the first and second circuit descriptions both comprising non-parasitic components; and
simulating the circuit using both the first and second circuit descriptions, the simulating comprising using the first circuit description during at least one simulation time step and also using the separate second circuit description during the at least one simulation time step, without the first and second circuit descriptions being combined into a single netlist during the simulating.

* * * * *